(12) United States Patent
Takei et al.

(10) Patent No.: US 7,687,223 B2
(45) Date of Patent: Mar. 30, 2010

(54) UNDERLAYER COATING FORMING COMPOSITION FOR LITHOGRAPHY CONTAINING CYCLODEXTRIN COMPOUND

(75) Inventors: Satoshi Takei, Toyama (JP); Tetsuya Shinjo, Toyama (JP); Keisuke Hashimoto, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 508 days.

(21) Appl. No.: 11/666,342

(22) PCT Filed: Oct. 25, 2005

(86) PCT No.: PCT/JP2005/019613

§ 371 (c)(1),
(2), (4) Date: Jun. 7, 2007

(87) PCT Pub. No.: WO2006/049046

PCT Pub. Date: May 11, 2006

(65) Prior Publication Data

US 2007/0292767 A1 Dec. 20, 2007

(30) Foreign Application Priority Data

Nov. 1, 2004 (JP) .............................. 2004-318134

(51) Int. Cl.
*G03C 1/825* (2006.01)
*G03F 7/09* (2006.01)
*G03F 7/20* (2006.01)
*G03F 7/30* (2006.01)

(52) U.S. Cl. ................. 430/271.1; 430/270.1; 430/311; 430/325; 430/326; 430/330; 430/910; 430/914

(58) Field of Classification Search ........................ None
See application file for complete search history.

(56) References Cited

U.S. PATENT DOCUMENTS

| 5,693,691 | A | 12/1997 | Flaim et al. |
| 5,919,599 | A | 7/1999 | Meador et al. |
| 6,323,310 | B1 | 11/2001 | Puligadda et al. |
| 2007/0135581 | A1 * | 6/2007 | Takei et al. ............... 525/329.7 |

FOREIGN PATENT DOCUMENTS

| JP | A-60-223121 | 11/1985 |
| JP | 5-165219 | * 7/1993 |
| JP | A-2000-294504 | 10/2000 |
| JP | A-2002-012847 | 1/2002 |
| JP | A-2002-047430 | 2/2002 |
| JP | A-2002-107938 | 4/2002 |
| JP | A-2002-190519 | 7/2002 |
| JP | A-2002-207295 | 7/2002 |
| WO | WO 99/56178 A1 | 11/1999 |
| WO | WO 02/05035 A1 | 1/2002 |
| WO | WO 02/071155 A1 | 9/2002 |
| WO | WO 2004/061526 A1 | 7/2004 |
| WO | WO 2005/043248 A1 | 5/2005 |

OTHER PUBLICATIONS

JPO English abstract for JP5-165219.*
Machine-assisted English translation of JP5-165219 as provided by JPO.*

* cited by examiner

*Primary Examiner*—Sin J. Lee
(74) *Attorney, Agent, or Firm*—Oliff & Berridge, PLC

(57) ABSTRACT

There is provided an underlayer coating forming composition for lithography for forming an underlayer coating having a high dry etching rate compared with photoresist, causing no intermixing with the photoresist, and excellent in property of filling hole on the semiconductor substrate, which is used in lithography process of manufacture of semiconductor device. The composition comprises a cyclodextrin compound that 10% to 90% of total number of hydroxy groups in cyclodextrin is converted into an ether or ester group, a crosslinking compound, a crosslinking catalyst and a solvent.

12 Claims, 1 Drawing Sheet

UNDERLAYER COATING FORMING COMPOSITION FOR LITHOGRAPHY CONTAINING CYCLODEXTRIN COMPOUND

TECHNICAL FIELD

The present invention relates to a novel composition for forming underlayer coating for lithography, an underlayer coating formed from the composition and a method for forming photoresist pattern by use of the underlayer coating.

In addition, the present invention relates to an underlayer coating for lithography that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist layer due to substances generated from a semiconductor substrate on baking under heating, and the like; and an underlayer coating forming composition for forming the underlayer coating.

Further, the present invention relates to an underlayer coating forming composition for lithography that can be used for filling holes formed on a semiconductor substrate.

BACKGROUND ART

Conventionally, in the manufacture of semiconductor devices, micro-processing by lithography using a photoresist has been carried out. The micro-processing is a processing method comprising forming a thin film of a photoresist on a semiconductor substrate such as a silicon wafer or the like, irradiating actinic rays such as ultraviolet rays through a mask pattern on which a pattern for a semiconductor device is depicted, developing it to obtain a photoresist pattern, and etching the substrate using the photoresist pattern as a protective film, thereby forming fine unevenness corresponding to the pattern on the surface of the substrate. However, in recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of random reflection and standing wave of actinic rays from a substrate have become serious problems. Accordingly, it has been widely studied to provide an anti-reflective coating between the photoresist and the substrate (bottom antireflective coating) in order to resolve the problem. As the anti-reflective coating, from a viewpoint of easy of use, many considerations have been done on organic anti-reflective coatings made of a light absorbing substance and a polymer compound and the like. For example, they are described in U.S. Pat. No. 5,919,599 and U.S. Pat. No. 5,693,691, and the like.

The physical properties desired for organic ant-reflective coating include high absorbance to light and radioactive rays, no intermixing with the photoresist layer (being insoluble in photoresist solvents), no diffusion of low molecular substances from the anti-reflective coating into the topcoat photoresist upon baking under heating, and a higher dry etching rate than the photoresist.

In recent years, in order to solve interconnection delay that has become clear with miniaturization in pattern rule of semiconductor devices, it has been considered to use copper as interconnect material, and to apply Dual Damascene process as Interconnect forming method on the semiconductor substrate. And, in Dual Damascene process, via holes are formed and an anti-reflective coating is formed on a substrate having a high aspect ratio. Therefore, the anti-reflective coating for use in this process is required to have filling property by which holes can be filled without gap, flattening property by which a flat coating can be formed on the surface of substrate, and the like.

However, it is difficult to apply organic material for anti-reflective coating on a substrate having a high aspect ratio, and in recent years, material with particular emphasis on filling property or flattening property has been developed (see, for example Patent Documents 1, 2, 3 and 4)

In addition, in the production of devices such as semiconductors, in order to reduce poisoning effect of a photoresist layer induced by a dielectric layer, JP-A-2002-12847 discloses a method in which a barrier layer formed from a composition containing a crosslinkable polymer and the like is provided between the dielectric layer and the photoresist layer.

As mentioned above, in the recent manufacture of semiconductor devices, in order to attain several effects represented by anti-reflective effect, it comes to provide an organic underlayer coating formed from a composition containing an organic compound between a semiconductor substrate and a photoresist layer, that is, as an underlayer of the photoresist. And, in order to satisfy required performance for underlayer coatings for which the diversity is increased, it is always required to develop new underlayer coatings.

In the meantime, an anti-reflective coating forming composition containing a saccharide compound is known. For example, an anti-reflective coating forming composition containing a cellulose compound is known (see, for example Patent Documents 5 and 6). Is also disclosed a pattern forming process by use of an a water-soluble anti-reflective organic coating comprising burrane being a polysaccharide as a main component (see, for example Patent Document 7). In addition, an anti-reflective coating material containing a polysaccharide having silyl substituents is disclosed (see, for example Patent Document 8).

Patent Document 1: JP-A-2000-294504 (2000)
Patent Document 2: JP-A-2002-47430 (2002)
Patent Document 3: JP-A-2002-190519 (2002)
Patent Document 4: WO 02/05035 pamphlet
Patent Document 5: WO 99/56178 pamphlet
Patent Document 6: WO 02/071155 pamphlet
Patent Document 7: JP-A-60-223121 (1985)
Patent Document 8: JP-A-2002-107938 (2002)

DISCLOSURE OF INVENTION

Problem to be Solved by the Invention

An object of the present invention is to provide an underlayer coating forming composition that can be used for the manufacture of semiconductor devices, and to provide an underlayer coating for lithography that causes no intermixing with a photoresist applied and formed as an upper layer and that has a high dry etching rate compared with the photoresist, and an underlayer coating forming composition for forming the underlayer coating.

In addition, an object of the present invention is to provide to an underlayer coating forming composition for lithography that is excellent in property for filling holes formed on a semiconductor substrate.

Further, another object of the present invention is to provide an underlayer coating for lithography that can be used for an underlayer anti-reflective coating for reducing reflection of exposure irradiation light from a semiconductor substrate to a photoresist formed on a semiconductor substrate in a lithography process of the manufacture of semiconductor devices, a flattening coating for flattening a semiconductor substrate having unevenness, a coating for preventing contamination of a photoresist layer due to substances generated from a semiconductor substrate on baking under heating, and the like; and an underlayer coating forming composition for forming the underlayer coating.

Also, further object of the present invention is to provide to a method for forming underlayer coating for lithography by use of the underlayer coating forming composition, and a method for forming a photoresist pattern.

Means for Solving the Problem

Taking the abovementioned present status into account, the present inventors eagerly investigated, and as a result of it, they found the use of an underlayer coating forming composition containing a cyclodextrin compound makes possible to form an excellent underlayer coating, and they completed the present invention.

That is, the present invention relates to as a first aspect, an underlayer coating forming composition for lithography comprising a cyclodextrin compound that 10% to 90% of total number of hydroxy groups in cyclodextrin is converted into a group of formula (1)

wherein $R_1$ is $C_{1-10}$alkyl group or an aromatic group that may be substituted with a group selected from the group consisting of halogen atom, $C_{1-6}$alkoxy group, phenyl group, cyano group and nitro group, or a group of formula (2)

wherein $R_2$ is $C_{1-10}$alkyl group or an aromatic group that may be substituted with a group selected from the group consisting of halogen atom, $C_{1-6}$alkoxy group, phenyl group, cyano group and nitro group, a crosslinking compound, a crosslinking catalyst and a solvent.

As a second aspects the present invention relates to the underlayer coating forming composition for lithography as described in the first aspect, wherein $R_1$ is $C_{1-3}$alkyl group.

As a third aspect, the present invention relates to the underlayer coating forming composition for lithography as described in the first aspect, wherein $R_2$ is $C_{1-3}$alkyl group.

As a fourth aspect the present invention relates to the underlayer coating forming composition for lithography as described in the first aspect, wherein $R_1$ is a nitrogen-containing aromatic group.

As a fifth aspect, the present invention relates to the underlayer coating forming composition for lithography as described in the first aspect, wherein the cyclodextrin is a cyclodextrin of α, β or γ type.

As a sixth aspect, the present invention relates to the underlayer coating forming composition for lithography as described in the first aspect, wherein the crosslinking compound is a nitrogen-containing compound having a nitrogen atom substituted with hydroxymethyl group alkoxymethyl group.

As a seventh aspect, the present invention relates to the underlayer coating forming composition for lithography as described in the first aspect, wherein the crosslinking catalyst is an aromatic sulfonic acid compound.

As an eighth aspect, the present invention relates to the underlayer coating forming composition for lithography as described in the first aspect, further comprising a polymer compound having a structural unit of formula (3)

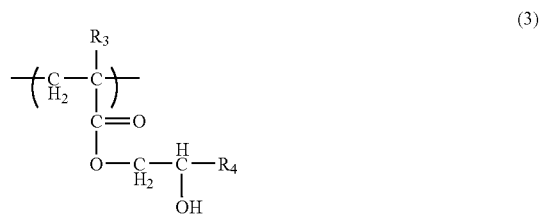

wherein $R_3$ and $R_4$ independently of each other are hydrogen atom or methyl group, in a proportion of 50 to 100% based on the whole structural units constituting the polymer compound.

As a ninth aspect, the present invention relates to the underlayer coating forming composition for lithography as described in the first aspect, further comprising a photoacid generator.

As a tenth aspect, the present invention relates to the underlayer coating forming composition for lithography as described in the first aspect wherein the solvent has a boiling point of 145° C. to 220° C.

As an eleventh aspect, a method for forming photoresist pattern for use in manufacture of semiconductor device, comprising coating the underlayer coating forming composition for lithography as described in any one of the first to tenth aspects on a semiconductor substrate, and baking it to form an underlayer coating, forming a photoresist layer on the underlayer coating, exposing the semiconductor substrate covered with the underlayer coating and the photoresist layer to light, and developing the photoresist layer after the exposure to light.

As a twelfth aspect, the underlayer coating forming composition as described in the first aspect, in which the composition is used for forming an underlayer coating by coating the composition on a semiconductor substrate having a hole with an aspect ratio shown in height/diameter of 1 or more, and baking it.

Effect of the Invention

The underlayer coating forming composition for lithography of the present invention can attain a high filling property inside holes without occurrence of void (gap).

As the composition can fill and flatten unevenness on substrates having holes, the film thickness of photoresists formed thereon can be improved in uniformity. Therefore, good photoresist pattern form can be formed even in the process by use of substrates having holes.

The underlayer coating forming composition for lithography of the present invention can provide an underlayer coating that has a high dry etching rate compared with photoresists, and cause no intermixing with photoresists.

In addition, the underlayer coating formed from the underlayer coating forming composition for lithography according to the present invention can be used as an anti-reflective coating, a flattening coating, and a coating for preventing contamination of a photoresist, etc. Consequently, the present invention enables the formation of photoresist pattern in lithography process of the manufacture of semiconductor device to be carried out easily and in a high accuracy.

Further, the underlayer coating formed from the underlayer coating forming composition for lithography according to the present invention contains a cyclodextrin compound having inclusion property. Thus, the underlayer coating can adsorb low molecular weight compounds that come from the amine component contained in the semiconductor substrate and generate on baking, thereby inhibiting resist poisoning phenomenon (a phenomenon causing any damage to a protective group on a photoresist).

BEST MODE FOR CARRYING OUT THE INVENTION

The underlayer coating forming composition for lithography according to the present invention contains a cyclodextrin compound, a crosslinking compound, a crosslinking catalyst and a solvent. The composition can further contain a polymer compound, a photoacid generator and a surfactant, and the like.

The proportion of the solid content in the underlayer coating forming composition of the present invention is not specifically limited and is for example 0.5 to 50 mass %, or 1 to 30 mass %, or 5 to 25 mass %, or 8 to 15 mass %. In this specification, the solid content means all components in the underlayer coating forming composition for lithography from which the organic solvent is excluded.

The cyclodextrin compound used in the underlayer coating forming composition for lithography of the present invention is a cyclodextrin compound that hydroxy groups in cyclodextrin is converted into a group of formula (1)

In the formula, $R_1$ is $C_{1-10}$alkyl group, an aromatic group or a group of formula (2)

The $C_{1-10}$alkyl group and aromatic group may be substituted with a group selected from the group consisting of halogen atom, $C_{1-8}$alkoxy group, phenyl group, cyano group and nitro group In the group of formula (2), $R_2$ is $C_{1-10}$alkyl group or an aromatic group.

The $C_{1-10}$alkyl group and aromatic group may be substituted with a group selected from the group consisting of halogen atom, $C_{1-6}$alkoxy group, phenyl group, cyano group and nitro group. The $C_{1-10}$alkyl group is for example methyl group, ethyl group, isopropyl group, n-pentyl group, cyclohexyl group and n-octyl group, etc. The $C_{1-6}$alkoxy group is for example methoxy group, ethoxy group, isopropyloxy group and cyclohexyloxy group, etc. The halogen atom (the group of halogen) is chloro group, fluoro group, bromo group and iodo group. The aromatic group is for example carbon cyclic aromatic group such as benzene ring, naphthalene ring and anthracene ring, etc., and nitrogen-containing aromatic group such as pyrimidine ring, triazine ring, thiazole ring and imidazole ring, etc.

The compounds of formula (1) wherein $R_1$ is $C_{1-10}$alkyl group or an aromatic group correspond to compounds in which hydroxy group in cyclodextrin is converted into an ether group. The compounds of formula (1) wherein $R_1$ is a group of formula (2) correspond to compounds in which hydroxy group in cyclodextrin is converted into an ester group.

The cyclodextrin is a compound having many hydroxy groups, and has a low solubility in solvents. Thus, it is difficult to use it as such in underlayer coating forming compositions by using solvents. Therefore, the cyclodextrin compound used in the underlayer coating forming composition for lithography of the present invention is a cyclodextrin that hydroxy groups thereof is converted into ether group or ester group and thereby is improved in solubility in solvents. As the cyclodextrin compound used in the underlayer coating forming composition for lithography of the present invention is a cyclodextrin compound that 10% or more, for example 10% to 90%, or 20% to 80%, or 30% to 60% of total number of hydroxy groups contained in cyclodextrin is converted into the group of formula (1), that is, an ether group or an ester group. In addition, the group of formula (1) in cyclodextrin compounds may be present in a state of only ether group or ester group, or in a mixture of the ether group and ester group.

Specific examples of $R_1$ in formula (1) are methyl group, ethyl group, isopropyl group, cyclohexyl group, n-octyl group, cyanomethyl group, methoxymethyl group, benzyl group, chloropropyl group, phenyl group, naphthyl group, anthryl group, fluorophenyl group, pyridyl group, 2-pyrimidinyl group, 6-triazinyl group, 4,6-dimethoxytriazin-2-yl group, 2,4dinitrophenyl group and 2-chlorotriazin-4-yl group, etc.

Specific examples of $R_1$ in formula (2) are methyl group, ethyl group, isopropyl group, cyclohexyl group, n-octyl group, phenylethyl group, trifluoromethyl group, chloromethyl group, cyanomethyl, phenyl group, naphthyl group, anthryl group, fluorophenyl group, ethoxymethyl group, bromophenyl group, chloronaphthyl group, nitrophenyl group, pyridyl group, 2-pyrimidinyl group, triazinyl group, benzyl group, 2-thiazolyl group and 2-benzooxazolyl group, etc.

The cyclodextrin compound used in the present invention is preferably a cyclodextrin of α, β or γ type that 10% to 90% of total number of hydroxy groups in cyclodextrin is converted into a group of formula (1). The cyclodextrin of α, β or γ type is a cyclodextrin consisting of 6, 7 or 8 glucopyranose units, respectively.

The cyclodextrin compound used in the present invention can be obtained according to the following processes.

For example, the cyclodextrin compound that $R_1$ in formula (1) is $C_{1-10}$alkyl group or an aromatic group can be obtained by reacting a cyclodextrin with an alkyl compound or aromatic compound having a leaving group in the presence of a base in a suitable solvent. The alkyl compound having a leaving group is methyl iodide, ethyl iodide, 2-iodopropane, 1-bromopentane, benzyl bromide, methoxymethyl chloride, bromoacetonitrile and 1-bromooctane, etc. The aromatic compound having a leaving group is 2-chlorotriazine, 2chloro-4,6-dimethoxytriazine and 2-chloropyrimidine, 2,4-dinitrochlorobenzene, etc. The base is sodium hydroxide, sodium carbonate, sodium acetate, potassium carbonate, sodium methoxide, pyridine, 4-(N,N-dimethylamino)pyridine, and triethyl amine, etc.

In addition, the cyclodextrin compound that $R_1$ in formula (1) is the above-mentioned aromatic group can be obtained by subjecting to a reaction (Mitsunobu reaction) between a cyclodextrin and an aromatic compound having a phenolic hydroxy group in the presence of triphenylphosphine and diethyl azodicarboxylate in a suitable solvent. The aromatic compound having a phenolic hydroxy group is phenol, paracresol, 1-naphthol, 2-naphthol, 2-hydroxyanthracene, 9-hydroxyanthracene, 4-hydroxypyridine, and 3-hydroxypyridine, etc.

Further, the cyclodextrin compound that $R_1$ in formula (1) is the group of formula (2) can be obtained by converting hydroxy group into an ester group by the reaction of a cyclodextrin with an acid chloride, an acid bromide, a carbonyl imidazole compound, a carboxylic active ester compound and an acid anhydride, etc. For example, the conversion of the hydroxy group of a cyclodextrin into an acetyloxy group can be carried out by reacting a cyclodextrin with acetylchloride or acetic anhydride under a condition by use of a base such as pyridine, etc.

For the conversion of hydroxy group into ester group, the following compounds can be used: an acid chloride, an acid bromide, a carbonyl imidazole compound, and carboxylic active ester compound, etc. derived from carboxylic compounds such as acetic acid, propionic acid, butyric acid, cyclohexane carboxylic acid, chloroacetic acid, trifluoroacetic acid, cyanoacetic acid, ethoxyacetic acid, isobutyric acid, benzoic acid, bromobenzoic acid, hydroxybenzoic acid, iodobenzoic acid, nitrobenzoic acid, methylbenzoic acid, ethoxybenzoic acid, tert-butoxybenzoic acid, naphthalene carboxylic acid, chloronaphthalene carboxylic acid, hydroxynaphthalene carboxylic acid and anthracene carboxylic acid, etc. In addition, the anhydrides of these carboxylic compounds can be also used. Further, the conversion of hydroxy group on cyclodextrin into ester group can be carried out by reacting a cyclodextrin with the above-mentioned carboxylic compound in presence of a condensation agent such as dicyclohexylcarbodiimide, etc.

The proportion of the conversion of hydroxy group on a cyclodextrin into ester group can be controlled by altering the equivalent weight of an acid chloride, an acid bromide, a carbonyl imidazole compound, carboxylic active ester compound and an acid anhydride, etc. that are used.

The cyclodextrin can be obtained by treating starch with an enzyme such as CGTase or the like. In addition, the cyclodextrin of α, β and γ type, etc. is commercially available, and these can be used for obtaining the cyclodextrin compound. Further, some dextrin compounds are commercially available (for example trade name: CAVASOL W7M manufactured by Wacker-Chemie GmbH), and these cyclodextrin compounds can be used for the underlayer coating forming composition for lithography of the present invention.

The amount of hydroxy groups remaining on the cyclodextrin compound can be determined according to a general hydroxy group value measurement method. For example, the amount of hydroxy groups remaining on the cyclodextrin compound can be measured by acetylating a cyclodextrin compound with acetic anhydride in the presence of pyridine, converting excess acetic anhydride into acetic acid with addition of water, and determining the amount of the acetic acid with an alkali.

The underlayer coating forming composition for lithography according to the present invention contains a crosslinking compound. As the crosslinking compound, compounds having two or more, for example 2 to 6, or 2 to 4 substituents that can react with hydroxy group on the cyclodextrin compound are used.

The use of such a crosslinking compound causes a reaction between the cyclodextrin compound and the crosslinking compound when baking is carried out in order to form an underlayer coating, and consequently the formed underlayer coating has a crosslinking structure. Thus, the underlayer coating becomes tough, and has a low solubility in organic solvents used for photoresist solution that is applied on the underlayer. The substituents that can react with hydroxy group of the cyclodextrin compound include isocyanate group, epoxy group, hydroxymethylamino group, and alkoxymethylamino group, etc. Therefore, compounds having two or more, for example 2 to 6 or 2 to 4 of these substituents can be used as the crosslinking compound.

The crosslinking compounds in the present invention include nitrogen-containing compounds having nitrogen atoms substituted with hydroxymethyl group or alkoxymethyl group. For example, they include nitrogen-containing compounds having nitrogen atoms substituted with hydroxymethyl group, methoxymethyl group, ethoxymethyl group, butoxymethyl group and hexyloxymethyl group, or the like.

They specifically include nitrogen-containing compounds such as hexamethoxymethyl melamine, tetramethoxymethyl benzoguanamine, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone, etc.

The crosslinking compounds also include commercially available compounds such as methoxymethyl type melamine compounds manufactured by Nihon Cytec Industries Inc. (former Mitsui Cytec Co., Ltd.) (trade name: Cymel 300, Cymel 301, Cymel 303, Cymel 350), butoxymethyl type melamine compounds (trade name: Mycoat 506, Mycoat 508), glycoluril compounds (trade name: Cymel 1170, Powderlink 1174), methylated urea resins (trade name: UFR 65), butylated urea resins (trade name: UFR300, U-VAN 10S60, U-VAN 10R, U-VAN 11HV), urea/formaldehyde resins manufactured by Dainippon Ink and Chemistry Incorporated (high condensation type, trade name: Beckamine J-300S, Beckamine P-955, Beckamine N) and the like.

In addition, the crosslinking compounds may be compounds obtained by condensation of the above-mentioned melamine compounds, urea compounds, glycoluril compounds and benzoguanamine compounds in which hydrogen atom of amino group is substituted with hydroxymethyl group or alkoxymethyl group. For example, compounds having a high molecular weight produced from a melamine compound (trade name: Cymel 303) and a benzoguanamine compound (trade name: Cymel 1123), which are disclosed in U.S. Pat. No. 6,323,310 can be used.

Further, the crosslinking compounds that can be used include polymer compounds produced by use of acrylamide compounds or methacrylamide compounds substituted with hydroxymethyl group or alkoxymethyl group, such as N-hydroxymethylacrylamide, N-methoxymethylmethacrylamide, N-ethoxymethylacrylamide, and N-butoxymethylmethacrylamide, etc. Such polymers include for example poly(N-butoxymethylacrylamide), a copolymer of N-butoxymethylacrylamide and styrene, a copolymer of N-hydroxymethylmethacrylamide and methylmethacrylate, a copolymer of N-ethoxymethylmethacrylamide and benzylmethacrylate, and a copolymer of N-butoxymethylacrylamide, benzylmethacrylate and 2-hydroxypropylmethacrylate, and the like.

The crosslinking compounds can be used singly or in a combination of two or more.

The crosslinking compounds can be used in an amount of 1 to 100 mass parts, or 3 to 70 mass parts, or 5 to 50 mass parts, or 10 to 40 mass parts, or 20 to 30 mass parts based on 100 mass parts of the cyclodextrin compound. The alternation of the kind or content of the crosslinking compound makes possible to control photoresist profile or step-coatability of base substrate.

The underlayer coating forming composition for lithography according to the present invention comprises a crosslinking catalyst. The use of the crosslinking catalyst accelerates a reaction of the crosslinking compound.

The crosslinking catalyst includes acid compounds such as p-toluene sulfonic acid, trifluoromethane sulfonic acid, methane sulfonic acid, pyridinium-p-toluene sulfonic acid, salicylic acid, camphor sulfonic acid, sulfosalicylic acid, citric acid, benzoic acid, and hydroxy benzoic acid, etc.

As the crosslinking catalyst, aromatic sulfonic acid compounds can be used. Specific examples of the aromatic sulfonic acid compounds include p-toluene sulfonic acid, pyridinium-p-toluenesulfonic acid, sulfosalicylic acid, 4-chlorobenzenesulfonic acid, 4-hydroxybenzenesulfonic acid, benzenesulfonic acid, 1-naphthalenesulfonic acid, and pyridinium-1-naphthalenesulfonic acid, etc.

The crosslinking catalyst can be used singly or a combination of two or more.

The crosslinking catalyst can be used in an amount of 0.01 to 10 mass parts, or 0.05 to 8 mass parts, or 0.1 to 5 mass parts, or 0.3 to 3 mass parts, or 0.5 to 1 mass part based on 100 mass parts of the cyclodextrin compound.

The underlayer coating forming composition for lithography according to the present invention can comprise a polymer compound. The polymer compound is not specifically limited. Addition polymerized polymers and condensation polymerized polymers such as polyester, polystyrene, polyimide, acrylic polymer, methacrylic polymer, polyvinyl ether, phenol novolak, naphthol novolak polyether, polyamide, polycarbonate, and the like can be used. It is preferable to use polymer compounds having aromatic ring structure acting as light absorbing moiety, such as benzene ring, naphthalene ring, anthracene ring, triazine ring, quinoline ring and quinoxaline ring, etc.

As the polymer compound, polymer compounds having a structural unit of formula (3) in a proportion of 50 to 100% based on the whole structural units constituting the polymer compound can be used. In formula (3), $R_3$ and $R_4$ independently of each other are hydrogen atom or methyl group.

The polymer compounds having a structural unit of formula (3) in a proportion of 50 to 100% based on the whole structural units constituting the polymer compound can be synthesized by polymerization reaction by use of 2-hydroxyethyl acrylate, 2-hydroxyethyl methacrylate, 2-hydroxypropyl acrylate or 2-hydroxypropylmethacrylate.

The polymer compounds can be synthesized by using only 2-hydroxyethyl acrylate, 2-hydroxyethyl methacrylate, 2-hydroxypropyl acrylate or 2-hydroxypropylmethacrylate. In addition, compounds that can be polymerized with the acrylate compound or the methacrylate compound under the condition satisfying the proportion of the structural units can be used for the synthesis of the polymer compounds. The compounds that can be polymerized include acrylic acid, methacrylic acid, acrylate compounds, methacrylate compounds, acrylamide compounds, methacrylamide compounds, vinyl compounds, styrene compounds, maleimide compounds, maleic anhydride and acrylontrile, etc.

Specific examples of the polymer compounds include poly (2-hydroxyethyl acrylate), poly(2-hydroxyethyl methacrylate), poly(2-hydroxypropyl acrylate), poly(2-hydroxypropyl methacrylate), a copolymer of 2-hydroxyethyl acrylate and 2-hydroxypropyl acrylate, a copolymer of 2-hydroxyethyl methacrylate and 2-hydroxypropyl methacrylate, a copolymer of 2-hydroxyethyl acrylate and methyl methacrylate, a copolymer of 2-hydroxypropyl methacrylate and ethyl acrylate, a copolymer of 2-hydroxypropyl methacrylate and benzyl methacrylate, a copolymer of 2-hydroxyethyl methacrylate and anthrylmethyl methacrylate, a copolymer of 2-hydroxyethyl methacrylate and styrene, and a copolymer of 2-hydroxyethyl acrylate and 4-hydroxystyrene, and the like.

The use of the polymer compounds makes possible to control refractive index, attenuation coefficient and dry etching rate, etc. of the underlayer coating formed from the underlayer coating forming composition for lithography according to the present invention.

The molecular weight of the polymer compounds is for example 1000 to 300000, or 3000 to 100000, or for example 5000 to 50000, or 9000 to 20000 in weight average molecular weight (in terms of standard polystyrene).

When the polymer compounds are contained in the underlayer coating forming composition for lithography according to the present invention, they can be used in an amount of 1 to 100 mass parts, or 10 to 500 mass parts, or 20 to 200 mass parts, or 30 to 100 mass parts, or 40 to 50 mass parts based on 100 mass parts of the cyclodextrin compound.

The underlayer coating forming composition for lithography according to the present invention can contain a photoacid generator. The photoacid generator can adjust the acidity of the underlayer coating as it generates an acid on the exposure of photoresists. This is used as a measure for conforming the acidity of the underlayer coating to that of the photoresist applied thereon. In addition, the adjustment of the acidity of the underlayer coating makes possible to adjust the pattern shape of the photoresist formed thereon.

The photoacid generator includes onium salt compounds, sulfoneimide compounds, and disulfonyl diazomethane compounds, etc.

The onium salt compounds include iodonium salt compounds such as diphenyl iodonium hexafluoro phosphate, diphenyl iodonium trifluoromethane sulfonate, diphenyl iodontum nonafluoro-n-butane sulfonate, diphenyl iodonium perfluoro-n-octane sulfonate, diphenyl iodonium camphor sulfonate, bis(4tert-butylphenyl) iodonium camphor sulfonate and bis(4-tert-butylphenyl) iodonium trifluoro methane sulfonate, etc., sulfonium salt compounds such as triphenyl sulfonium hexafluoro antimonate, triphenylsulfonium nonafluoro-n-butane sulfonate, triphenyl sulfonium camphor sulfonate and triphenyl sulfonium trifluoro methane sulfonate, etc.

The sulfoneimide compounds include for example N-(trifluoromethanesulfonyloxy) succinimide, N-nonafluoro-n-butanesulfonyloxy) succinimide, N-camphorsulfonyloxy) succinimide and N-(trifluoromethanesulfonyloxy) naphthalimide, etc.

The disulfonyl diazomethane compounds include for example bis(trifluoromethylsulfonyl) diazomethane, bis(cyclohexylsulfonyl) diazomethane, bis(phenylsulfonyl) diazomethane, bis(p-toluenesulfonyl) diazomethane, bis(2,4-dimethylbenzenesulfonyl) diazomethane, and methylsulfonyl-p-toluenesulfonyl diazomethane, etc.

The photoacid generator can be used singly or in a combination of two or more. When the photoacid generator is contained in the underlayer coating forming composition for lithography according to the present invention, the contained amount thereof is for example 0.01 to 10 mass parts, or 0.05 to 5 mass parts, or 0.1 to 1 mass part based on 100 mass parts of the cyclodextrin compound.

The underlayer coating forming composition for lithography according to the present invention can contain surfactants, rheology controlling agents and adhesive auxiliary agents, etc., if desired. The surfactants are effective for inhibiting occurrence of pinholes or striation, etc. The rheology controlling agents are effective for improving the fluidity of the underlayer coating forming composition, particularly for improving the filling property of the underlayer coating forming composition inside holes in the baking step. The adhesive auxiliary agents are effective for improving the adhesiveness between the semiconductor substrate or photoresist and the underlayer coating, particularly for preventing separation of the photoresist in development.

The surfactants include for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl other, etc., polyoxyethylene alkyl allyl ethers, e.g., polyoxyethylene octyl phenol ether, polyoxyethylene nonyl phenol ether, etc., polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Jemco Inc.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The surfactants may be used singly or in combination of two or more. When the surfactant is contained in the underlayer coating forming composition according to the present invention, the contained amount is generally 0.2 mass % or less, or 0.1 mass % or less in the all components of the underlayer coating forming composition.

The solvent used in the underlayer coating forming composition for lithography according to the present invention is any solvent that can dissolve the solid content to give a homogeneous solution. Such solvents that can be used include for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, water and butyl lactate, etc. These solvents are used singly or in combination of two or more.

Further, solvents having a high boiling point such as propylene glycol monobutyl ether, propylene glycol monobutyl ether acetate and the like can be mixed and used.

In the process of formation of the underlayer coating, the underlayer coating forming composition of the present invention is applied on a semiconductor substrate and then baked as mentioned below. It is preferable that the boiling point of the solvents ranges from 145 to 220° C., or from 155 to 200° C., or from 160 to 180° C. in consideration of baking temperature. In particular, when the composition is used for semiconductor substrates having an aspect ratio shown in height/diameter of 1 or more, it is preferable that the boiling point of the solvent falls in the above-mentioned range. The use of solvents having a relatively high boiling point as mentioned above can afford the maintenance of fluidity of the underlayer coating forming composition for a certain period of time while baking is carried out, and thereby filling property into holes and flattening property by the underlayer coating formed from the underlayer coating forming composition can be improved. Among the above-mentioned solvents, butyl lactate, propylene glycol monobutyl ether, propylene glycol monomethyl ether acetate, cyclohexanone, diethylene glycol monomethyl ether or a mixture thereof is preferable.

Hereinafter, the utilization of the underlayer coating forming composition for lithography of the present invention is described.

Semiconductor substrates on which the underlayer coating forming composition of the present invention is applied are for example substrates having holes of an aspect ratio shown in height/diameter of 1 or more as shown in FIG. 1 that are commonly used for the manufacture of semiconductor devices (for example, silicon/silicon dioxide coat substrate, silicon nitride substrate, glass substrate, ITO substrate or the like). The semiconductor substrates having holes are used particularly in dual damascene process. In addition, the underlayer coating forming composition for lithography according to the present invention can be also used for semiconductor substrates having holes of aspect ratio less than 1 or semiconductor substrates having steps. Further, the underlayer coating forming composition for lithography according to the present invention can be also used for semiconductor substrates having no step or the like.

On a semiconductor substrate, the underlayer coating forming composition of the present invention is coated by a suitable coating method, for example, with a spinner, a coater or the like, and thereafter the substrate is baked to form an underlayer coating. The conditions of baking are suitably selected from baking temperature of 60 to 220° C. and baking time of 0.3 to 60 minutes. Preferably the baking temperature is 130 to 220° C. or 170 to 220° C. and the baking time is 0.3 to 5 minutes or 0.5 to 2 minutes. The thickness of the underlayer coating is for example 0.01 to 3.0 µm, or for example 0.03 to 1.0 µm.

Next, a photoresist layer is formed on the underlayer coating. The formation of the photoresist layer can be conducted by well-known process, that is, by application of a photoresist composition solution on the underlayer coating and baking.

The photoresist to be coated and formed on the underlayer coating of the present invention is not specifically limited so long as it is sensitive to an exposure light, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shinetsu Chemical Co., Ltd., and the like can be mentioned.

Subsequently, exposure to light is carried out through a predetermined mask. For the exposure to light, KrF excimer laser beam (wavelength 248 nm), ArF excimer laser beam (wavelength 193 nm) and F2 excimer laser beam (wavelength 157 nm), etc. can be used. After the exposure, post exposure bake may be performed, if necessary. The post exposure bake is conducted by suitably selecting from a heating temperature of 70 to 150° C. and a heating time of 0.3 to 10 minutes.

Next, development is conducted by use of a developer. For example in case where a positive type photoresist is used, the development results in removal of exposed part of the photoresist and forming of photoresist pattern.

The developer includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, choline or the like, amine aqueous solution such as ethanolamine, propylamine, ethylenediamine or the like. As the developer, 2.38 mass % tetramethyl ammonium hydroxide aqueous solution that is widely used can be used. Further, surfactants can be added in these developers. The condition of development is suitably selected from a temperature of 5 to 50° C. and a time of 0.1 to 5 minutes.

Then, removal of the underlayer coating and processing of the semiconductor substrate are conducted by using the photoresist pattern formed as mentioned above as a protective coating. The removal of the underlayer is conducted by use of a gas such as tetrafluoromethane, perfluorocyclobutane, perfluoropropane, trifluoromethane, carbon monoxide, argon, oxygen, nitrogen, sulfur hexafluoride, difluoromethane, nitrogen trifluoride and chlorine trifluoride, etc.

Before or after forming the underlayer coating of the present invention on a semiconductor substrate, an organic anti-reflective coating layer may be applied and formed. The anti-reflective coating composition used in such a case is not specifically limited, and can be arbitrarily selected from those conventionally used in the prior lithography process, and used. In addition, the anti-reflective coating can be formed by coating by the conventional method, for example, with a spinner or a coater, and baking. The anti-reflective coating composition includes for example one containing as main components a light absorbing compound, a polymer and a solvent, one containing as main components a polymer having a light absorbing group through chemical bond, a crosslinking agent and a solvent, one containing as main components a light absorbing compound, a crosslinking agent and a solvent, and one containing as main components a polymer type crosslinking agent having a light absorbing property and a solvent, and the like. The anti-reflective coating composition may contain an acid component, an acid generator component, a rheology controlling agent, or the like, if necessary. The light absorbing compounds that can be used are any compounds having a high absorption for light at photosensitive characteristic wavelength region of the photosensitive component in the photoresist provided on the anti-reflective coating, and include for example benzophenone compounds, benzotriazole compounds, azo compounds, naphthalene compounds, anthracene compounds, anthraquinone compounds, triazine compounds, and the like. The polymers include polyesters, polyimides, polystyrenes, novolak resins, polyacetals, acrylic polymers, and the like. The polymers having a light absorbing group through chemical bond include polymers having a light absorbing aromatic ring structure such as anthracene ring, naphthalene ring, benzene ring, quinoline ring, quinoxaline ring or thiazole ring.

The semiconductor substrates on which the underlayer coating forming composition of the present invention is applied may be substrates on which an inorganic anti-reflective coating is formed by CVD method or the like, and the underlayer coating of the present invention can be formed thereon.

The underlayer coating formed from the underlayer coating forming composition for lithography according to the present invention may have an absorption for light used in the lithography process. In such a case, the underlayer coating can be used as a layer having a preventive effect against light reflected from the substrate, that is, as an underlayer anti-reflective coating.

Further, the underlayer coating of the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion of substances formed in the substrate on baking under heating to the upper layer photoresist, and as a barrier layer for reducing any poisoning effect of the photoresist layer by the semiconductor substrate dielectric layer.

In addition, the underlayer coating formed from the underlayer coating forming composition can be used as a filling agent that can fill via holes without gap or as a flattening agent for flattening a substrate surface, by applying it for the substrate on which via holes are formed and which is used in dual damascene process.

Hereinafter, the present invention will be described based on examples but the present invention is not limited thereto.

EXAMPLES

Synthetic Example 1

In 20 g of dimethyl formamide, 5.00 g of acetyl-β-cyclodextin (manufactured by Wacker-Chemie GmbH, trade name: CAVASOL W7A, proportion of terminal groups of cyclodextrin: hydroxy group 67%, acetyloxy group 33%), 6.2 g of 2-chloro-4,6-dimethoxytriazine and 2.2 g of sodium carbonate were added. After flowing nitrogen in the solution for 30 minutes, it was subjected to a reaction under nitrogen atmosphere at 70° C. for 10 hours. After cooling the reaction solution to room temperature, solid content was removed by filtration. Then, water was added in the filtrate, the precipitate that was separated out was collected through filtration, and dried to obtain a product as white solid.

The resulting product was a cyclodextrin compound that the proportion of terminal groups of cyclodextrin was 20% of hydroxy group, 33% of acetyloxy group and 47% of 4,6-dimethoxytriazin-2-oxy group.

In the meantime, what the proportion of terminal groups of cyclodextrin was 20% of hydroxy group, 33% of acetyloxy group and 47% of 4,6-dimethoxytriazin-2-yl-oxy group means that 33% and 47% of the total number of hydroxy groups contained in cyclodextrin are converted to acetyloxy group and 4,6-dimethoxytriazin-2-yl-oxy group, respectively, and the remaining 20% is hydroxy group.

Synthetic Example 2

In 120 g of ethyl lactate, 30 g of 2-hydroxyethyl acrylate was added, and after flowing nitrogen in the solution for 30 minutes, the temperature was raised to 70° C. While the solution was kept at 70° C., 0.3 g of azobisisobutyronitrile was added, and stirred under nitrogen atmosphere at 70° C. for 24 hours to obtain a solution containing poly(2-hydroxyethyl) acrylate. GPO analysis of the obtained poly(2-hydroxyethyl) acrylate showed that it had a weight average molecular weight (in terms of polystyrene) of 9800.

Example 1

In 1237 g of propylene glycol monomethyl ether, 100 g of methyl-β-cyclodextrin (manufactured by Wacker-Chemie GmbH, trade name: CAVASOL W7M, proportion of terminal groups of cyclodextrin: hydroxy group 50%, methoxy group 50%), 35.0 g of tetramethoxymethyl glycoluril (manufactured by Nihon Cytec Industries Inc. (former Mitsui Cytec Co., Ltd.), trade name: Powderlink 1174), 1.147 g of pyridinium-p-toluene sulfonic acid and 1.00 g of surfactant (manufactured by Dainippon Ink and Chemicals Incorporated, trade name: R-30) were added to obtain a 10 mass % solution. Thereafter, the solution was filtered through a micro filter made of polyethylene having a pore diameter of 0.05 μm to prepare an underlayer coating forming composition solution for lithography.

Example 2

In 1143 g of water, 100 g of chlorotriazinyl-β-cyclodextrin (manufactured by Wacker-Chemie GmbH, trade name: CAVASOL W7MCT, proportion of terminal groups of cyclodextrin: hydroxy group 50%, chlorotriazin-4-yl-oxy group 50%), 20 g of tetramethoxymethyl glycoluril, 6 g of pyridinium-p-toluene sulfonic acid and 1 g of surfactant R-30 (manufactured by Dainippon Ink and Chemicals Incorporated) were added to obtain a 10 mass % solution. Thereafter the solution was filtered through a micro filter made of polyethylene having a pore diameter of 0.05 μm to prepare an underlayer coating forming composition solution for lithography.

Example 3

In 100 g of the solution containing poly(2-hydroxyethy) acrylate obtained in Synthetic Example 2, 4.773 g of acetyl-β-cyclodextrin (manufactured by Wacker-Chemie GmbH, trade name: CAVASOL W7A, proportion of terminal groups of cyclodextrin: hydroxy group 67%, acetyloxy group 33%), 7.00 g of tetramethoxymethyl glycoluril, 0.070 g of pyridinium-p-toluene sulfonic acid, 0.200 g of surfactant R-30 (manufactured by Dainippon Ink and Chemicals Incorporated), 73.62 g of propylene glycol monomethyl ether and 91.8 g of ethyl lactate were added to obtain a 10 mass % solution. Thereafter, the solution was filtered through a micro filter made of polyethylene having a pore diameter of 0.05 μm to prepare an underlayer coating forming composition solution for lithography.

Example 4

In a mixed solvent of 7.621 g of propylene glycol monomethyl ether and 17.783 g of ethyl lactate, 1.920 g of the cyclodextrin compound obtained in Synthetic Example 1, 0.0025 g of pyridinium-p-toluene sulfonic acid, and 0.010 g of surfactant R-30 (manufactured by Dainippon Ink and Chemicals Incorporated) were added to obtain an 8.7 mass % solution. Thereafter, the solution was filtered through a micro filter made of polyethylene having a pore diameter of 0.05 μm to prepare an underlayer coating forming composition solution for lithography.

Dissolution Test in Photoresist Solvent

The underlayer coating forming composition solutions for lithography obtained in Examples 1 to 4 were coated on silicon wafer substrates by means of a spinner, respectively. The coated silicon wafer substrates were baked at 205° C. for 1 minute on a hot plate to form underlayer coatings (film thickness 0.50 μm). The underlayer coatings were dipped in ethyl lactate, propylene glycol monomethyl ether acetate, and propylene glycol monomethyl ether that are solvents used for photoresists, and as a result it was confirmed that the resulting underlayer coatings were insoluble in these solvents.

Test of Intermixing with Photoresist

The underlayer coating forming composition solutions for lithography obtained in Examples 1 to 4 were coated on silicon wafer substrates by means of a spinner, respectively. The coated silicon wafer substrates were baked at 205° C. for 1 minute on a hot plate to form underlayer coatings (film thickness 0.50 μm). On each underlayer coating was coated a photoresist solution (trade name: GARS 8105G1 manufactured by Fuji Photo Film Co., Ltd. and trade name: SEPR 430 manufactured by Shinetsu Chemical Co., Ltd.) by means of a spinner. The coated wafers were heated at 90° C. or 110° C. for 1.5 minute on a hot plate. After exposure of the photoresists to light, post exposure bake was performed at 90° C. for 1.5 minute. After developing the photoresists, the film thickness of the underlayer coatings was measured and it was confirmed that no intermixing occurred between the underlayer coatings and the photoresist layers.

Test of Flattening Rate and Filling Property

The underlayer coating forming composition solutions for lithography obtained in Examples 1 to 4 were coated on silicon dioxide ($SiO_2$) wafer substrates having holes (diameter: 0.13 μm) depth: 0.80 μm) by means of a spinner, respectively. The used substrates are substrates having Iso (isolated) and Dense (dense) patterns of holes as shown in FIG. 1. Iso pattern is a pattern in which the distance from the center of a hole to the center of the adjacent hole is five times as long as the diameter of the hole. Denso pattern is a pattern in which the distance from the center of a hole to the center of the adjacent hole is one time as long as the diameter of the hole.

The coated substrates were baked at 205° C. for 1 minute on a hot plate to form underlayer coatings. The film thickness thereof was 0.20 μm at the open area where hole pattern is not present in the vicinity. The flattening rate by the underlayer coatings was assessed by observing with a scanning electron microscope (SEM) the sectional form of the substrates. The flattening rate was calculated according to the following equation. The flattening rate was 100% when holes on the substrate were perfectly flattened.

Flattening Rate=[1−(dimple depth a of underlayer coating at the center of holes)/(hole depth b)]×100

In addition, no void (gap) was observed inside the holes, and it was observed that the inside of the holes was filled with the underlayer coating.

TABLE 1

|  | Film Thickness (nm) | | | Flattening Rate (%) | | |
| --- | --- | --- | --- | --- | --- | --- |
|  | Iso | Dense | Bias | Iso | Dense | Bias |
| Example 1 | 200 | 100 | 100 | 100 | 100 | 0 |
| Example 2 | 210 | 70 | 140 | 100 | 95 | 5 |
| Example 3 | 210 | 90 | 120 | 100 | 100 | 0 |
| Example 4 | 180 | 60 | 120 | 100 | 90 | 10 |

In the underlayer coatings of Examples 1 to 4, difference (Bias) in film thickness on Iso (isolated) and Dense (dense) patterns was small. It is assumed that the solution of the underlayer coating forming composition smoothly flows into holes even at Dense part having larger hole number (hole density) per unit area on the substrate than Iso part, and that consequently difference in film thickness of Iso part and Dense part becomes small and flattening rate becomes high.

Further, the underlayer coating forming compositions of Examples 1 to 4 were able to flatten holes on substrates irrespective of Iso part and Dense part.

Measurement of Optical Parameter

The underlayer coating forming composition solution prepared in Example 2 was coated on a silicon wafer substrate by means of a spinner. The coated silicon wafer substrate was baked at 205° C. for 1 minute on a hot plate to form an underlayer coating (film thickness 0.20 μm). On the underlayer coating, refractive index (n) and attenuation coefficient (k) at a wavelength of 193 nm were measured with a spectroscopic ellipsometer. As a result of it, refractive index (n) was 1.73 and attenuation coefficient (k) was 0.20.

The underlayer coating forming composition solution prepared in Example 4 was coated on a silicon wafer substrate by means of a spinner. The coated silicon wafer substrate was baked at 205° C. for 1 minute on a hot plate to form an underlayer coating (film thickness 0.20 μm). On the underlayer coating, refractive index (n) and attenuation coefficient (k) at a wavelength of 193 nm were measured with a spectroscopic ellipsometer. As a result of it, refractive index (n) was 1.84 and attenuation coefficient (k) was 0.23.

Measurement of Dry Etching Rate

The underlayer coating forming composition solutions for lithography obtained in Examples 1 to 4 were coated on silicon wafer substrates by means of a spinner, respectively. The coated silicon wafer substrates were baked at 205° C. for 1 minute on a hot plate to form underlayer coatings (film thickness 0.20 μm). Then, dry etching rate on these underlayer coatings was measured with RIE system ES401 manufactured by Nippon Scientific Co., Ltd. under the condition in which $CF_4$ was used as dry etching gas.

The results are shown in Table 2. The selectivity corresponds to dry etching rate of an underlayer coating in case where the dry etching rate of the photoresist for ArF excimer laser lithography (trade name: GARS 8105G1 manufactured by Fuji Photo Film Co., Ltd.) under a similar condition as above is regarded as 1.00.

TABLE 2

|  | Selectivity |
| --- | --- |
| Example 1 | 2.66 |
| Example 2 | 2.70 |
| Example 3 | 2.10 |
| Example 4 | 2.79 |

It was confirmed that the etching rate of the underlayer coatings obtained from the underlayer coating forming compositions in Examples 1 to 4 was higher that of the photoresists.

An underlayer coating is required to have a higher dry etching rate than a photoresist. This is because in the process in which the base of the substrate is exposed by development of the photoresist and dry etching, a higher dry etching rate of the underlayer coating compared with that of the photoresist can lead to reduction in the amount of the photoresist scraped by etching during the removal of the underlayer coating by etching, that is, lead to lowering in film thickness of photoresist.

BRIEF DESCRIPTION OF DRAWINGS

In FIG. 1, symbol a is a dimple depth of the underlayer coating at the center of the hole, b is an initial depth of hole on the substrate, c is the underlayer coating, and d is the substrate.

Figure 1:
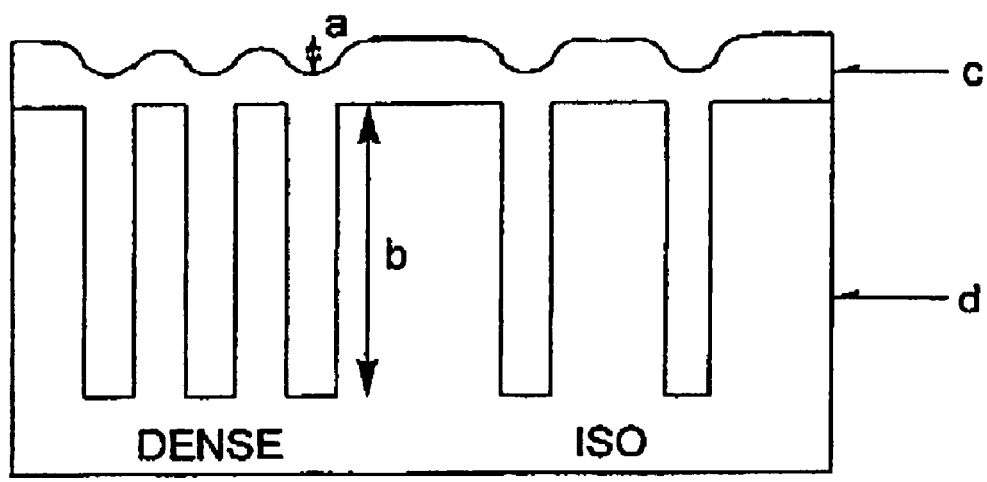
FIG. 1 is a sectional view of an underlayer coating formed on a substrate having holes.

The invention claimed is:

1. An underlayer coating forming composition for lithography comprising a cyclodextrin compound that 10% to 90% of total number of hydroxy groups in cyclodextrin is converted into a group of formula (1)

wherein $R_1$ is $C_{1-10}$alkyl group or an aromatic group that may be substituted with a group selected from the group consisting of halogen atom, $C_{1-6}$alkoxy group, phenyl group, cyano group and nitro group, or a group of formula (2)

wherein $R_2$ is $C_{1-10}$alkyl group or an aromatic group that may be substituted with a group selected from the group consisting of halogen atom, $C_{1-6}$alkoxy group, phenyl group, cyano group and nitro group, a crosslinking compound, a crosslinking catalyst and a solvent.

2. The underlayer coating forming composition for lithography according to claim 1, wherein $R_1$ is $C_{1-3}$alkyl group.

3. The underlayer coating forming composition for lithography according to claim 1, wherein $R_2$ is $C_{1-3}$alkyl group.

4. The underlayer coating forming composition for lithography according to claim 1, wherein $R_1$ is a nitrogen-containing aromatic group.

5. The underlayer coating forming composition for lithography according to claim 1, wherein the cyclodextrin is a cyclodextrin of α, β or γ type.

6. The underlayer coating forming composition for lithography according to claim 1, wherein the crosslinking compound is a nitrogen-containing compound having a nitrogen atom substituted with hydroxymethyl group alkoxymethyl group.

7. The underlayer coating forming composition for lithography according to claim 1, wherein the crosslinking catalyst is an aromatic sulfonic acid compound.

8. The underlayer coating forming composition for lithography according to claim 1, further comprising a polymer compound having a structural unit of formula (3)

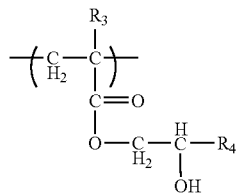
(3)

wherein R₃ and R₄ independently of each other are hydrogen atom or methyl group, in a proportion of 50% to 100% based on the whole structural units constituting the polymer compound.

9. The underlayer coating forming composition for lithography according to claim 1, further comprising a photoacid generator.

10. The underlayer coating forming composition for lithography according to claim 1, wherein the solvent has a boiling point of 145° C. to 220° C.

11. A method for forming photoresist pattern for use in manufacture of semiconductor device, comprising the steps of:

coating the underlayer coating forming composition for lithography according to claim 1 on a semiconductor substrate, and baking it to form an underlayer coating, forming a photoresist layer on the underlayer coating, exposing the semiconductor substrate covered with the underlayer coating and the photoresist layer to light, and developing the photoresist layer after the exposure to light.

12. The underlayer coating forming composition according to claim 1, in which the composition is used for forming an underlayer coating by coating the composition on a semiconductor substrate having a hole with an aspect ratio shown in height/diameter of 1 or more, and baking it.

* * * * *